US007902894B2

(12) United States Patent
Mohtashemi

(10) Patent No.: US 7,902,894 B2
(45) Date of Patent: Mar. 8, 2011

(54) ACCURATE HYSTERETIC COMPARATOR AND METHOD

(75) Inventor: Behzad Mohtashemi, Los Gatos, CA (US)

(73) Assignee: Alpha and Omega Semiconductor Inc., Sunnyvale, CA (US)

( * ) Notice: Subject to any disclaimer, the term of this patent is extended or adjusted under 35 U.S.C. 154(b) by 55 days.

(21) Appl. No.: 12/493,142

(22) Filed: Jun. 26, 2009

(65) Prior Publication Data

US 2010/0327914 A1    Dec. 30, 2010

(51) Int. Cl.
    *H03K 5/22* (2006.01)
(52) U.S. Cl. ............... 327/205; 327/65; 327/66; 327/67
(58) Field of Classification Search .................. None
    See application file for complete search history.

(56) References Cited

U.S. PATENT DOCUMENTS

| 5,099,142 | A  | * | 3/1992  | Barre ........................... 327/205 |
| 5,313,114 | A  | * | 5/1994  | Poletto et al. .................. 327/65 |
| 5,517,134 | A  | * | 5/1996  | Yaklin ........................... 327/65 |
| 5,563,534 | A  | * | 10/1996 | Rossi et al. .................... 327/77 |
| 6,127,854 | A  | * | 10/2000 | Illegems ........................ 327/66 |
| 6,229,350 | B1 | * | 5/2001  | Ricon-Mora .................... 327/77 |
| 7,187,223 | B2 | * | 3/2007  | Yeo et al. ....................... 327/206 |
| 7,595,676 | B2 | * | 9/2009  | Trifonov ........................ 327/206 |

* cited by examiner

Primary Examiner — Tuan Lam
(74) Attorney, Agent, or Firm — Chein-Hwa Tsao; Chemily LLC

(57) ABSTRACT

A hysteretic comparator is proposed for comparing input signals and producing an output signal VOT with a hysteresis window $V_{hys}$. The hysteretic comparator includes a differential input stage with current output (DICO) having input transistors with transconductance $Gm_{mx}$ for converting the input signals, with an input stage transconductance $Gm_{in}$, into intermediate signal currents. A steerable offset current generator, driven by a steering control signal, steers an offset current source IOS to alternative offset currents. A current-to-voltage summing converter (IVSC) sums up the intermediate signal currents and the offset currents and converts the result into VOT plus the steering control signal causing $V_{hys} = IOS/Gm_{in}$. A feedback resistance $R_{NF}$ is connected to the input transistors to form a negative feedback loop. The $R_{NF}$ is sized such that $GM_{in}$, hence $V_{hys}$, becomes essentially solely dependent upon the feedback conductance $G_{NF} = 1/R_{NF}$ independent of the $Gm_{mx}$ thus its process and environmental variation.

18 Claims, 4 Drawing Sheets

Present Invention

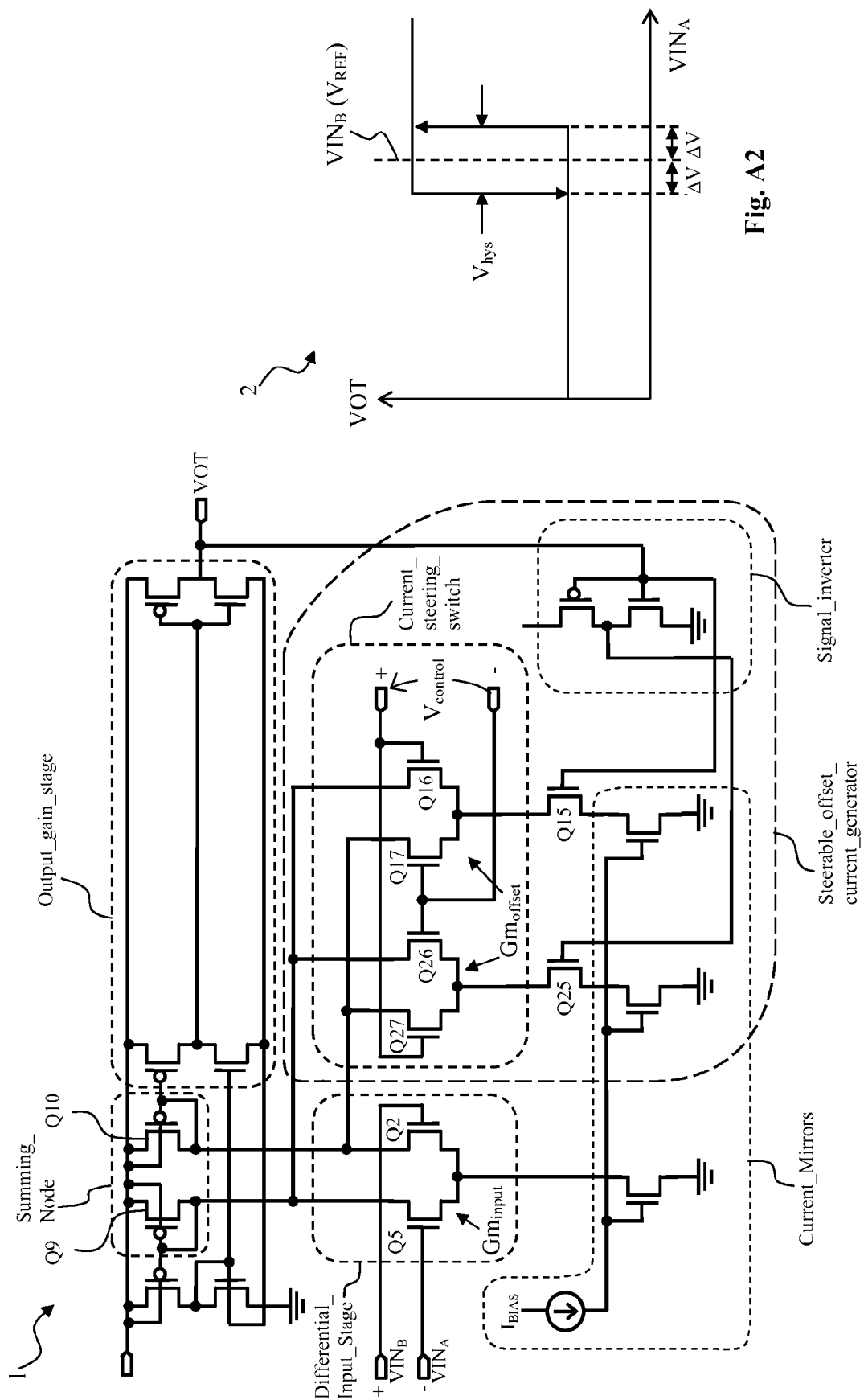
Fig. A1 Prior Art
Fig. A2

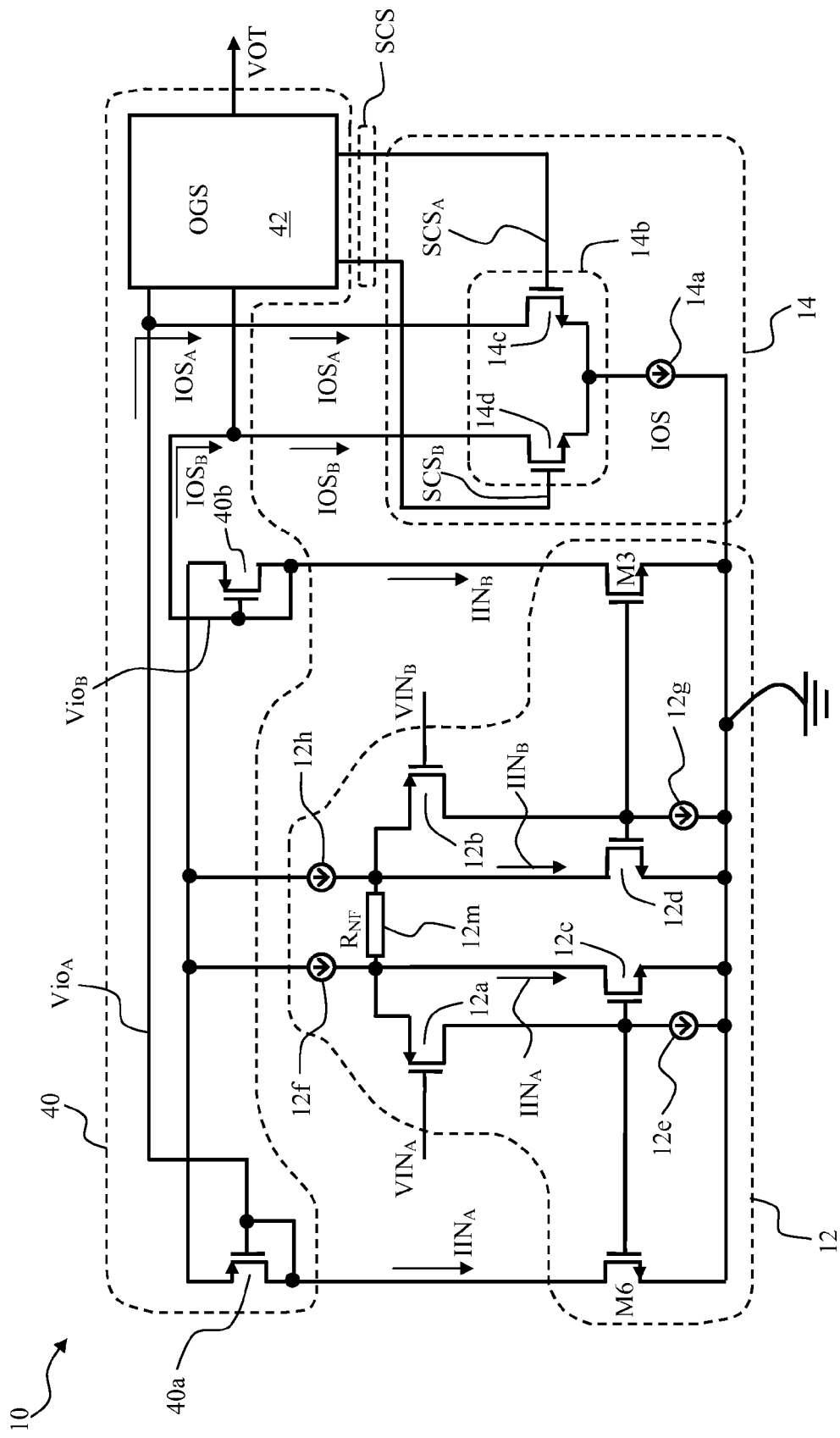
Fig. 1A Present Invention

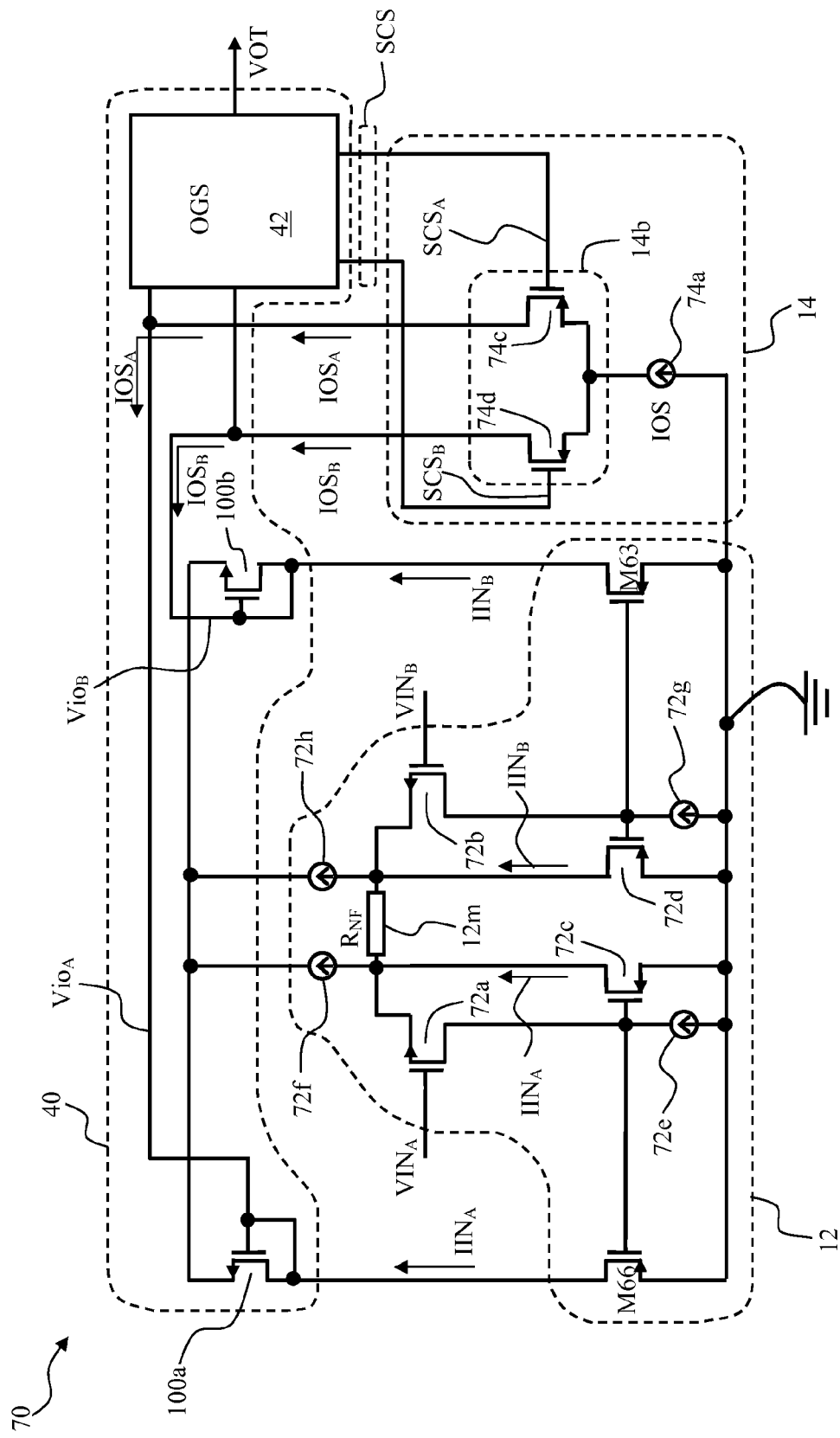
Fig. 1B Present Invention

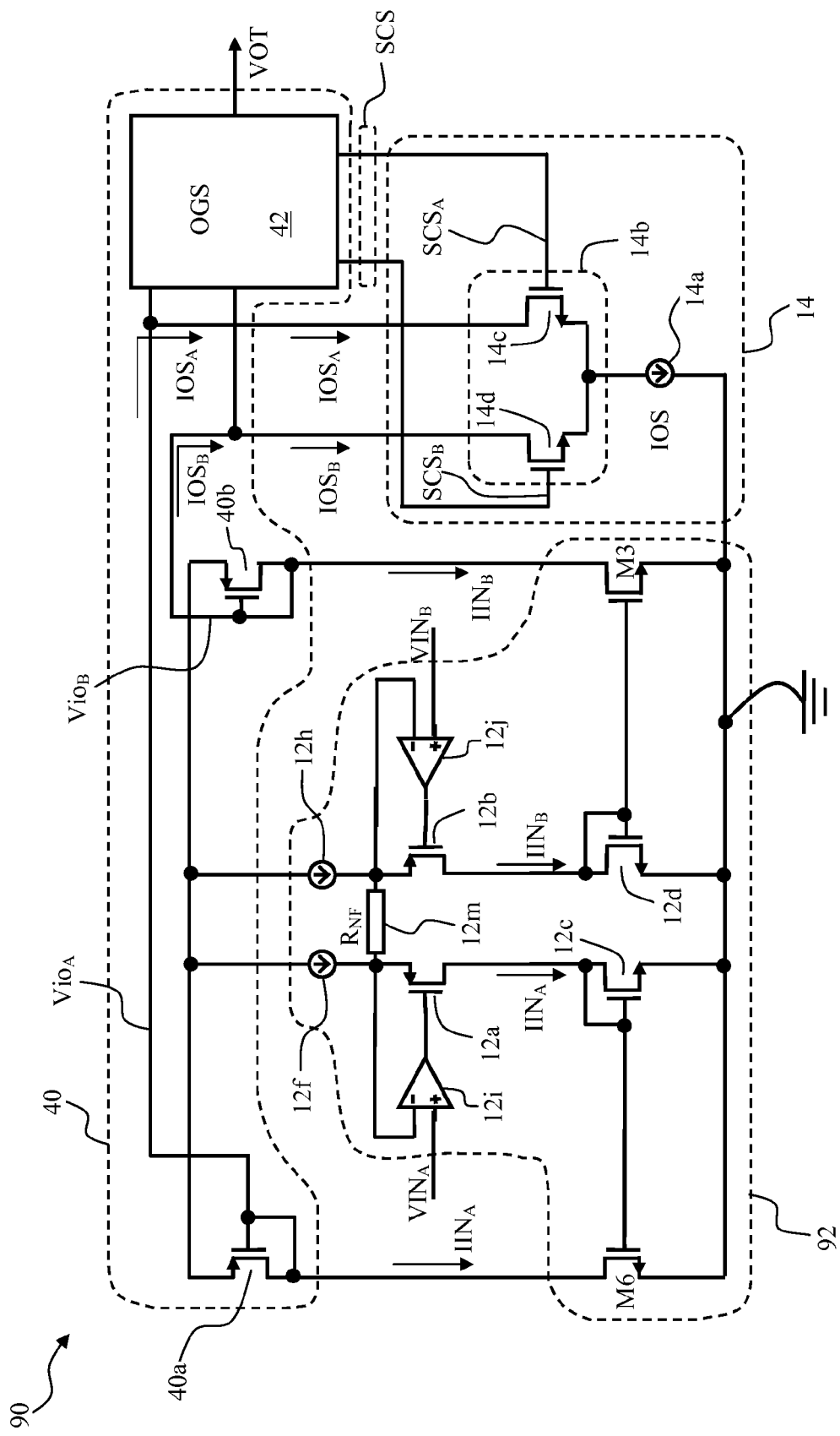
Fig. 1C Present Invention

ACCURATE HYSTERETIC COMPARATOR AND METHOD

CROSS REFERENCE TO RELATED APPLICATIONS

Field of Invention

This invention relates generally to the field of electrical circuits. More specifically, the present invention is directed to the design of an analog signal comparator.

BACKGROUND OF THE INVENTION

An analog signal comparator is a common functional building block for numerous analog electrical circuits. A hysteretic signal comparator has a hysteresis loop around its reference signal and is, for example, commonly employed in a feedback electrical control circuit to avoid, in the absence of such a hysteresis loop, undesirable excessive oscillations of a controlled signal around its target value.

FIG. A1 illustrates a prior art U.S. Pat. No. 6,229,350 entitled "Accurate, fast, and user programmable hysteretic comparator" by Ricon-Mora et al, hereinafter referred to as U.S. Pat. No. 6,229,350. FIG. A1 illustrates the prior art hysteretic comparator 1 and FIG. A2 illustrates its signal input/output (I/O) characteristics 2. FIG. A2 applies to any hysteretic comparator. The key I/O signals of the prior art hysteretic comparator 1 are a pair of input signals $VIN_A$ and $VIN_B$ and a 2-level output signal VOT. To those skilled in the art, in reference to input signal $VIN_B$ the VOT vs. $VIN_A$ characteristics of FIG. A2 exhibit a level transition around $VIN_A = VIN_B$ with a hysteresis window of $V_{hys} = 2*\Delta V$.

The prior art hysteretic comparator 1 has the following major functional blocks coupled to one another:
  A Differential_Input_Stage for differentially converting the input signal pair $VIN_A$ and $VIN_B$ into intermediate current signals.
  A Summing_Node and an Output_Gain_Stage for converting and amplifying the intermediate current signals into the final 2-level output signal VOT.
  A Steerable_offset_current_generator for generating and injecting, through its Current_steering_switch, an offset current into the Differential_Input_Stage thus producing the hysteresis window of $V_{hys}$ in the VOT vs. $VIN_A$ characteristics. A Signal_inverter is included to convert VOT into differential control signals required internally by the Steerable_offset_current_generator. Notice that $V_{hys}$ is further made user programmable through a "$V_{control}$" signal applied to the Steerable_offset_current_generator.
  Current_mirrors, rooted in a current source "$I_{BIAS}$", to supply a number of bias currents required by the Differential_Input_Stage and the Steerable_offset_current_generator.

As is known to those skilled in the art, the hysteresis window $V_{hys}$ of the prior art hysteretic comparator 1 is governed by the following equations:

$$V_{hys} = 2\Delta V = \frac{I_{(offset)}}{G_{m(input)}} = V_{control} \quad (1)$$

where $$I_{(offset)} = G_{m(offset)} * V_{(control)} \quad (2)$$

-continued $$G_m = \frac{2 I_{BIAS}}{V_{GS} - V_{th}} = \sqrt{2 I_{BIAS} * \text{Transistor\_Size} * K_{np}} \quad (3)$$

$$K_{np} = \text{electron/hole\_mobility} * C_{ox} \quad (4)$$

In the above equations, $G_{m(input)}$ refers to the transconductance of the differential transistor pair Q2 and Q5 within the Differential_Input_Stage. $G_{m(offset)}$ refers to the transconductance of the differential transistors Q16, Q17, Q26 and Q27 within the Steerable_offset_current_generator. $G_m$ refers to the transconductance of a generic transistor. $V_{GS}$ and $V_{th}$ refer respectively to the gate-source voltage and threshold voltage of a generic transistor. Knp is a transistor device parameter sensitive to its numerous fabrication processing tolerances. $C_{ox}$ is the gate oxide capacitance per area.

To be an accurate hysteretic comparator, $V_{hys}$ should be fabricated with tight tolerance and should exhibit low sensitivity to environmental variations such as temperature. From the above equations (1)-(4) it can be seen that the fractional variation of $V_{hys}$ tracks that of $G_{m(input)}$ and $G_{m(offset)}$. Furthermore, any mismatch of $G_m$ amongst the transistor pairs (for example, between Q2 and Q5) would cause an additional variation of $V_{hys}$. While this phenomenon applies to both bipolar and MOS transistors, the degree of $V_{hys}$ variation becomes especially serious with CMOS transistors. Unlike bipolar transistors, the $G_m$ of a CMOS transistor is small and $G_m$ of CMOS transistors do not match as well. In the prior art, for good matching and large transconductance the size of each of the differential CMOS transistors Q16, Q17, Q26, Q27 must become similar in size as each of the input CMOS transistors Q2, Q5. That means a large integrated circuit (IC) die area would be consumed to implement a simple comparator function, an expensive and unfeasible proposition. Therefore, there exists a need to create a simple hysteretic comparator with an accurate hysteresis window $V_{hys}$ without consuming a large IC die area.

SUMMARY OF THE INVENTION

A hysteretic comparator (HYSCP) is proposed for comparing two input signal voltages $VIN_A$, $VIN_B$ and producing a 2-level output signal VOT reflecting the relative magnitude between $VIN_A$ and $VIN_B$ with an accurate hysteresis window $V_{hys}$. The HYSCP includes:
  A differential input stage with current output (DICO) having a number of differentially connected input transistors with transistor transconductance $Gm_{trx}$ for converting $VIN_A$ and $VIN_B$, with an input stage transconductance $Gm_{in}$, into corresponding intermediate signal currents $IIN_A$ and $IIN_B$.
  A steerable offset current generator (SOCG) having a built-in offset current source IOS, two output offset currents $IOS_A$, $IOS_B$ and a current steering switch driven by a steering control signal and coupled to the IOS for, depending upon the logic state of the steering control signal, steering the IOS through either $IOS_A$ or $IOS_B$.
  A current-to-voltage summing converter (IVSC) connected to the $IIN_A$, $IOS_A$, $IIN_B$ and $IOS_B$ for respectively summing the currents ($IIN_A$, $IOS_A$) and the currents ($IIN_B$, $IOS_B$) and converting the summed currents into the 2-level output signal VOT plus the steering control signal having its logic states corresponding to the VOT levels thus causing $V_{hys} = IOS/Gm_{in}$.

The input transistors are connected so as to create negative feedback loops within the DICO that largely negates the transistor transconductance $Gm_{mx}$ from the input stage transconductance $Gm_{in}$. The DICO further includes a feedback resistance $R_{NF}$ connected to the input transistors and, additionally, the $R_{NF}$ is sized relative to the input transistors such that $Gm_{in}$ becomes dominated by and essentially equal to the feedback conductance $G_{NF}=1/R_{NF}$ independent of the $Gm_{mx}$, whose large variation over transistor fabrication process and device operating environment would otherwise cause a corresponding inaccuracy of the $V_{hys}$.

In a more specific embodiment, the number of differentially connected input transistors further includes:

A differentially connected pair of input switching transistor $TNX_{SA}$ and input switching transistor $TNX_{SB}$ with their (transistor transconductance, output impedance) respectively equal to $(Gm_{SA}, R_{SA})$ and $(Gm_{SB}, R_{SB})$.

A differential pair of input load transistor $TNX_{LA}$ and input load transistor $TNX_{LB}$, respectively coupled to $TNX_{SA}$ and $TNX_{SB}$ in a staggered configuration to create negative feedback loops, with their (transistor transconductance, output impedance) respectively equal to $(Gm_{LA}, R_{LA})$ and $(Gm_{LB}, R_{LB})$. Correspondingly, the $R_{NF}$ is sized to meet the following criterion:

$$\frac{1}{R_{NF}} \gg \frac{Gm_{SA}}{Gm_{LA} R_{SA}} + \frac{Gm_{SB}}{Gm_{LB} R_{SB}}$$

The pair of input switching transistor $TNX_{SA}$ and input switching transistor $TNX_{SB}$, and the pair of input load transistor $TNX_{LA}$ and input load transistor $TNX_{LB}$, are designed such that their transistor transconductances largely cancel out. This can be easily accomplished by making transistors of the same size and parameters.

For converting $VIN_A$ and $VIN_B$ into the intermediate signal current $IIN_A$, the DICO further includes a number of $IIN_A$-referencing current sources plus a current mirror connected to $TNX_{SA}$ and $TNX_{LA}$. For converting $VIN_A$ and $VIN_B$ into the intermediate signal current $IIN_B$, the DICO further includes a number of $IIN_B$-referencing current sources plus a current mirror connected to $TNX_{SB}$ and $TNX_{LB}$.

In a more specific embodiment, the current steering switch has a pair of differentially connected steering transistors in turn connected to the IOS for respectively supplying IOSA and IOSB. The steering control signal has a pair of differential steering signals respectively coupled to a control terminal of the steering transistors.

In a more specific embodiment, the IVSC includes:

A summing transistor $TNX_{SUMA}$ connected to the currents $(IIN_A, IOS_A)$ for summing them up and converting the summation into an interim differential output signal $Vio_A$.

A summing transistor $TNX_{SUMB}$ connected to the currents $(IIN_B, IOS_B)$ for summing them up and converting the summation into an interim differential output signal $Vio_B$.

An output gain stage (OGS) coupled to the interim differential output signals $(Vio_A, Vio_B)$ for amplifying them into the VOT and generating the steering control signal.

These aspects of the present invention and their numerous embodiments are further made apparent, in the remainder of the present description, to those of ordinary skill in the art.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative.

FIG. A1 illustrates a prior art hysteretic comparator under U.S. Pat. No. 6,229,350;

FIG. A2 illustrates signal input/output characteristics of a hysteretic comparator;

FIG. 1A illustrates the present invention hysteretic comparator;

FIG. 1B illustrates another embodiment of the present invention hysteretic comparator; and FIG. 1C illustrates another embodiment of the present invention hysteretic comparator.

DETAILED DESCRIPTION OF SPECIFIC EMBODIMENTS

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

FIG. 1A illustrates the present invention hysteretic comparator (HYSCP) 10. The present invention HYSCP 10 functions to compare two input signal voltages $VIN_A$, $VIN_B$ and produce a 2-level output signal VOT reflecting the relative magnitude between $VIN_A$ and $VIN_B$ with an accurate hysteresis window $V_{hys}$. The graph showing the hysteresis window $V_{hys}$ ($=2\Delta V$) in FIG. A2 also applies to this invention. The HYSCP includes:

A differential input stage with current output (DICO) 12 having a number of differentially connected input transistors with transistor transconductance $Gm_{mx}$ for converting $VIN_A$ and $VIN_B$, with an input stage transconductance $Gm_{in}$, into corresponding intermediate signal currents $IIN_A$ and $IIN_B$.

A steerable offset current generator (SOCG) 14 having a built-in offset current source IOS 14a, two output offset currents $IOS_A$, $IOS_B$ and a current steering switch 14b driven by a pair of steering control signals $SCS_A$ and $SCS_B$ jointly called steering control signals (SCS)) and coupled to the IOS 14a for, depending upon the logic state of the SCS, steering the IOS 14a through either offset current $IOS_A$ or offset current $IOS_B$. The current steering switch 14b has two source-coupled steering transistors 14c and 14d.

A current-to-voltage summing converter (IVSC) 40 connected to the $IIN_A$, $IOS_A$, $IIN_B$ and $IOS_B$ for respectively summing the currents ($IIN_A$, $IOS_A$ via summing transistor $TNX_{SUMA}$ 40a) and the currents ($IIN_B$, $IOS_B$ via summing transistor $TNX_{SUMB}$ 40b) and converting the summed currents into the 2-level output signal VOT plus SCS having its logic states corresponding to the VOT levels thus causing $V_{hys}=IOS/Gm_{in}$.

As a key element of the present invention, the DICO 12 further includes a feedback resistance $R_{NF}$ 12m connected to the input transistors. Additionally, the feedback resistance $R_{NF}$ 12m is sized relative to the input transistors such that $Gm_{in}$ becomes dominated by and essentially equal to the feedback conductance $G_{NF}=1/R_{NF}$ independent of the $Gm_{mx}$, whose large variation over transistor fabrication process and device operating environment would otherwise cause a corresponding inaccuracy of the $V_{hys}$.

As a more detailed embodiment, the number of differentially connected input transistors further includes:

A differentially connected pair of input switching transistors $TNX_{SA}$ 12a and $TNX_{SB}$ 12b. The $TNX_{SA}$ 12a has its (transistor transconductance, output impedance) equal to ($Gm_{SA}$, $R_{SA}$) while the $TNX_{SB}$ 12b has its (transistor transconductance, output impedance) equal to ($Gm_{SB}$, $R_{SB}$).

A differential pair of input load transistors $TNX_{LA}$ 12c and $TNX_{LB}$ 12d respectively coupled to $TNX_{SA}$ 12a and $TNX_{SB}$ 12b in a staggered configuration for an increased gain and to create negative feedback loops. The $TNX_{LA}$ 12c has its (transistor transconductance, output impedance) equal to ($Gm_{LA}$, $R_{LA}$) while the $TNX_{LB}$ 12d has its (transistor transconductance, output impedance) equal to ($Gm_{LB}$, $R_{LB}$). The gate of 12c may be coupled to the drain of 12a, and the drain of 12c may be coupled to the source of 12a. Likewise, the gate of 12d may be coupled to the drain of 12b, and the drain of 12d may be coupled to the source of 12b.

With the introduction of the $R_{NF}$ 12m, the governing equations for the present invention hysteresis window $V_{hys}$ become:

$$V_{hys} = 2\Delta V = \frac{IOS}{Gm_{in}} \quad (5)$$

$$Gm_{in} = \frac{Gm_{SA}}{Gm_{LA} R_{SA}} + \frac{1}{R_{NF}} + \frac{Gm_{SB}}{Gm_{LB} R_{SB}} \quad (6)$$

The SOCG 14 may be implemented in different ways, but should include the output offset currents $IOS_A$ and $IOS_B$. Equation (5) may be written more generally as:

$$V_{hys} = 2\Delta V = \frac{0.5 * (IOS_A + IOS_B)}{Gm_{in}} \quad (5A)$$

Hence, according to the present invention, when the $R_{NF}$ 12m is sized to meet the following criterion:

$$\frac{1}{R_{NF}} >> \frac{Gm_{SA}}{Gm_{LA} R_{SA}} + \frac{Gm_{SB}}{Gm_{LB} R_{SB}} \quad (7)$$

The governing equations for the present invention hysteresis window $V_{hys}$ become essentially independent of the various transistor device parameters. That is:

$$V_{hys} \approx IOS * R_{NF} \quad (8)$$

In addition, the transistors are designed such that the transconductances $Gm_{SA}$ and $Gm_{LA}$ are approximately equal (the same with transconductances $Gm_{SB}$ and $Gm_{LB}$), and largely cancel out such that equation (6) becomes:

$$Gm_{in} \approx \frac{1}{R_{SA}} + \frac{1}{R_{NF}} + \frac{1}{R_{SB}}$$

thus eliminating the transconductances of the transistors from the equation. The criterion of Equation (7) then becomes:

$$\frac{1}{R_{NF}} >> \frac{1}{R_{SA}} + \frac{1}{R_{SB}}$$

which is simple to accomplish since the impedances of the transistors are large, for example around 1MΩ. So the expression of $Gm_{in}$ simplifies to:

$$Gm_{in} \approx \frac{1}{R_{NF}}$$

As the value of an IC resistor is, when compared to the (transistor transconductance, output impedance) of the above input switching transistors and input load transistors, substantially less sensitive to the fabrication process variation and device operating environment, the present invention has achieved a simple hysteretic comparator with an accurate hysteresis window $V_{hys}$ without consuming a large IC die area. For example, the poly resistors made from an IC process can be controlled within an approximate 5% accuracy or even better while the corresponding transistor transconductance can vary over a 20% range.

For converting $VIN_A$ and $VIN_B$ into the intermediate signal current $IIN_A$, the DICO 12 further includes a number of $IIN_A$-referencing current sources 12e, 12f plus a current mirror (formed by transistor M6 and $TNX_{LA}$ 12c) connected to $TNX_{SA}$ 12a and $TNX_{LA}$ 12c. Current source 12e is connected to the gate of $TNX_{LA}$ 12c and should be smaller than current source 12f (e.g., by a half) which is connected to the source of $TNX_{SA}$ 12a. For converting $VIN_A$ and $VIN_B$ into the intermediate signal current $IIN_B$, the DICO 12 further includes a number of $IIN_B$-referencing current sources 12g, 12h plus a current mirror (formed by transistor M3 and $TNX_{LB}$ 12d) connected to $TNX_{SB}$ 12b and $TNX_{LB}$ 12d. Current source 12g is connected to the gate of $TNX_{LB}$ and should be smaller than current source 12h which is connected to the source of $TNX_{SB}$ 12b.

As another more detailed alternative embodiment, the summing transistor $TNX_{SUMA}$ 40a would sum up the currents ($IIN_A$, $IOS_A$) and convert the summation into an interim differential output signal $Vio_A$. Similarly, the summing transistor $TNX_{SUMB}$ 40b would sum up the currents ($IIN_B$, $IOS_B$) and convert the summation into an interim differential output signal $Vio_B$. Subsequently, an output gain stage (OGS) 42, coupled to the interim differential output signals ($Vio_A$, $Vio_B$), would amplify them into the 2-level output signal VOT while simultaneously generate the steering control signals (SCS). By way of example, the OGS 42 may generate the SCS using two inverters in series.

In the HYSCP 10 of FIG. 1A, the transistors 12a, 12b are p-channel transistors, and the transistors 12c, 12d are n-channel transistors. However, as an alternative embodiment of the present invention the transistor type may be reversed and this is illustrated in a HYSCP 70 of FIG. 1B which is similar to HYSCP 10 except that the transistor channel types are reversed, as are the directions of the currents and voltages. In the HYSCP 70, the transistors 72a, 72b are n-channel transistors respectively replacing transistors 12a, 12b. Likewise, the transistors 72c, 72d are p-channel transistors respectively replacing transistors 12c, 12d. The other transistors 100a, 100b, 74c, 74d, M63, M66 also change channel type and respectively replace transistors 40a, 40b, 14c, 14d, M3, M6, while the current sources 72e, 72f, 72g, 72h, 74a take the place of and switch directions as compared to current sources 12e, 12f, 12g, 12h, 14a of the HYSCP 10 of FIG. 1A. Note that although the side of the DICO 12 closest to the current sources 72f and 72g is at a higher voltage than the side of the DICO 12 closest to the IVSC 40, it is still shown as ground for the purposes of this description.

As additional alternative embodiments of the present invention, the negative feedback loop may be formed in various ways. FIG. 1C illustrates another HYSCP 90 in which all the circuit elements are the same as those of the HYSCP 10 of FIG. 1A except for portions of the DICO 12 of FIG. 1A now relabeled as 92. In the DICO 92, the transistors 12a, 12b, 12c, 12d, are not staggered with 12c placed instead in series with 12a and 12d placed in series with 12b. The transistors 12c and 12d each has gate to drain shorts to form current mirrors with transistors M6 and M3 respectively. The current sources 12e and 12g of FIG. 1A are eliminated from FIG. 1C. Instead, the DICO 92 includes operational amplifiers OpAmp$_A$ 12i and OpAmp$_B$ 12j, whose outputs are connected to the gate of transistors 12a, 12b, respectively. One input of op amps 12i, 12j is connected to VIN$_A$, VIN$_B$, respectively, and the other input is connected to the source of transistors 12a, 12b, respectively. The op amps 12i, 12j provide a negative feedback loop to the input transistors 12a, 12b, which minimizes the contributions of the transistor transconductance Gm$_{mx}$ to the input stage transconductance Gm$_{in}$ hence the hysteretic window V$_{hys}$, as explained below.

The input stage transconductance Gm$_{in}$ is:

$$Gm_{in} = \frac{Gm_{12a}}{[\text{op amp loop gain}]_{12i}} + \frac{1}{R_{NF}} + \frac{Gm_{12b}}{[\text{op amp loop gain}]_{12j}} \quad (9)$$

In the above Gm$_{12a}$ and Gm$_{12b}$ are the transconductance of transistors 12a and 12b respectively, and [op amp loop gain]$_{12i}$ and [op amp loop gain]$_{12j}$ are the op amp loop gain of op amps 12i and 12j respectively. The op amp loop gain is defined as:

$$\text{op amp loop gain}=1+(A*B)$$

Wherein A is the open loop gain of the amplifier, and B is the feedback factor. In the configuration as shown, the feedback factor equals one, so Equation (9) becomes:

$$Gm_{in} = \frac{Gm_{12a}}{1+A} + \frac{1}{R_{NF}} + \frac{Gm_{12b}}{1+A}$$

As the open loop gain of an op amp is by definition a very large value, the input transistor transconductances Gm$_{12a}$ and Gm$_{12b}$ are essentially negated from contributing to the input stage transconductance Gm$_{in}$ and the equation simplifies to:

$$Gm_{in} \approx \frac{1}{R_{NF}}$$

the same conclusion as the HYSCP 10 of FIG. 1.

Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. For example, while the present invention is illustrated using MOS transistors the same inventive concept can be alternatively embodied in bipolar transistor circuit as well. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

What is claimed are:

1. An accurate hysteretic comparator (HYSCP) for comparing an input signal voltage VIN$_A$ with an input signal voltage VIN$_B$ and producing a 2-level output signal VOT reflecting the relative magnitude between VIN$_A$ and VIN$_B$ with a hysteresis window V$_{hys}$, the HYSCP comprises:
    a differential input stage with current output (DICO) having a number of differentially connected input transistors with transistor transconductance Gm$_{mx}$ for converting said VIN$_A$ and VIN$_B$, with an input stage transconductance Gm$_{in}$, into corresponding IIN$_A$ and IIN$_B$;
    a steerable offset current generator (SOCG), controlled by a logic steering control signal, for generating and steering an offset current IOS through either one of its two output offset currents IOS$_A$ or IOS$_B$; and
    a current-to-voltage summing converter (IVSC) connected to the IIN$_A$, IOS$_A$, IIN$_B$ and IOS$_B$ for:
        respectively summing the currents (IIN$_A$, IOS$_A$) and the currents (IIN$_B$, IOS$_B$) and converting the summed currents into the 2-level output signal VOT plus the steering control signal having its logic states corresponding to the VOT levels thus causing V$_{hys}$=IOS/Gm$_{in}$; and
    wherein the input transistors are connected to form negative feedback loops, such that the transistor transconductance Gm$_{mx}$ are largely negated from the input stage transconductance Gm$_{in}$ and
    wherein the DICO further comprises a feedback resistance R$_{NF}$ connected to the input transistors such that Gm$_{in}$ becomes dominated by and essentially equal to the feedback conductance G$_{NF}$=1/R$_{NF}$ independent of the Gm$_{mx}$ whose large variation over transistor fabrication process and device operating environment would otherwise cause a corresponding inaccuracy of the V$_{hys}$.

2. The HYSCP of claim 1 wherein said SOCG further comprises a current steering switch driven by the steering control signal and coupled to the IOS for, depending upon the logic state of the steering control signal, steering the IOS through either IOSA or IOSB.

3. The HYSCP of claim 1 wherein said number of differentially connected input transistors further comprises:
    a differentially connected pair of input switching transistor TNX$_{SA}$ and input switching transistor TNX$_{SB}$ with their (transistor transconductance, output impedance) respectively equal to (Gm$_{SA}$, R$_{SA}$) and (Gm$_{SB}$, R$_{SB}$); and
    a differential pair of input load transistor TNX$_{LA}$ and input load transistor TNX$_{LB}$, respectively coupled to TNX$_{SA}$ and TNX$_{SB}$ in a staggered configuration, with their (transistor transconductance, output impedance) respectively equal to (Gm$_{LA}$, R$_{LA}$) and (Gm$_{LB}$, R$_{LB}$); and
correspondingly, the R$_{NF}$ is sized to meet the following criterion:

$$(1/R_{NF})>>(Gm_{SA}/(Gm_{LA} \times R_{SA}))+(Gm_{SB}/(Gm_{LB} \times R_{SB})).$$

4. The HYSCP of claim 3 wherein VIN$_A$ is connected to the gate of TNX$_{SA}$ and VIN$_B$ is connected to the gate of TNX$_{SB}$.

5. The HYSCP of claim 4 wherein, for converting the $VIN_A$ and $VIN_B$ into corresponding $IIN_A$ and $IIN_B$, said DICO further includes:
   first and second $IIN_A$-referencing current sources, bridging the $TNX_{SA}$ and $TNX_{LA}$ between IVSC and ground, plus a current mirror formed by $TNX_{LA}$ and a transistor bridging the IVSC and ground; and
   first and second $IIN_B$-referencing current sources, bridging the $TNX_{SB}$ and $TNX_{LB}$ between IVSC and ground, plus a current mirror formed by $TNX_{LB}$ and a transistor bridging the IVSC and ground.

6. The HYSCP of claim 5 wherein the gate of $TNX_{LA}$ is coupled to the drain of $TNX_{SA}$, the gate of $TNX_{LB}$ is coupled to the drain of $TNX_{SB}$, the drain of $TNX_{LA}$ is coupled to the source of $TNX_{SA}$, and the drain of $TNX_{LB}$ is coupled to the source of $TNX_{SB}$.

7. The HYSCP of claim 6 wherein the first $IIN_A$-referencing current source is connected between the gate of $TNX_{LA}$ and ground, and the second $IIN_A$-referencing current source is connected between the source of $TNX_{SA}$ and IVSC, and the first $IIN_B$-referencing current source is connected between the gate of $TNX_{LB}$ and ground, and the second $IIN_B$-referencing current source is connected between the source of $TNX_{SB}$ and IVSC.

8. The HYSCP of claim 7 wherein the first $IIN_A$-referencing current source is smaller than the second $IIN_A$-referencing current source, and the first $IIN_B$-referencing current source is smaller than the second $IIN_B$-referencing current source.

9. The HYSCP of claim 8 wherein the first $IIN_A$-referencing current source and the first $IIN_B$-referencing current source are approximately half the size of the second $IIN_A$-referencing current source and the second $IIN_B$-referencing current source, respectively.

10. The HYSCP of claim 1 wherein:
    said number of differentially connected input transistors further comprises:
       a differentially connected pair of input switching transistor $TNX_{SA}$ and input switching transistor $TNX_{SB}$ with their (transistor transconductance, output impedance) respectively equal to $(Gm_{SA}, R_{SA})$ and $(Gm_{SB}, R_{SB})$; and
       a differential pair of input load transistor $TNX_{LA}$ and input load transistor $TNX_{LB}$, respectively coupled to $TNX_{SA}$ and $TNX_{SB}$ in a serial configuration, with their (transistor transconductance, output impedance) respectively equal to $(Gm_{LA}, R_{LA})$ and $(Gm_{LB}, R_{LB})$;
    said DICO further comprises two operational amplifiers $OpAmp_A$ and $OpAmp_B$ driven respectively by $VIN_A$ and $VIN_B$, each configured with a negative feedback loop closed respectively with $TNX_{SA}$ and $TNX_{SB}$, for buffering the $VIN_A$ and $VIN_B$; and
    correspondingly, the $R_{NF}$ is sized to meet the following criterion:

$$(1/R_{NF}) >> (Gm_{SA}/(Gm_{LA} \times R_{SA})) + (Gm_{SB}/(Gm_{LB} \times R_{SB})).$$

11. The HYSCP of claim 10 wherein, for converting the $VIN_A$ and $VIN_B$ into corresponding $IIN_A$ and $IIN_B$, said DICO further includes:
    an $IIN_A$-referencing current source, bridging the $TNX_{SA}$ and the IVSC, plus a current mirror formed by $TNX_{LA}$ and a transistor bridging the IVSC and ground; and
    an $IIN_B$-referencing current source, bridging the $TNX_{SB}$ and the IVSC, plus a current mirror formed by $TNX_{LB}$ and a transistor bridging the IVSC and ground.

12. The HYSCP of claim 3 wherein the transconductances of the input switching transistors largely cancel out due to the negative feedback such that the criterion for the $R_{NF}$ becomes:

$$(1/R_{NF}) >> (1/R_{SA}) + (1/R_{SB}).$$

13. The HYSCP of claim 3 wherein, for converting said $VIN_A$ and $VIN_B$ into the intermediate signal current $IIN_A$, the DICO further comprises a number of $IIN_A$-referencing current sources plus a current mirror connected to $TNX_{SA}$ and $TNX_{LA}$.

14. The HYSCP of claim 3 wherein, for converting said $VIN_A$ and $VIN_B$ into the intermediate signal current $IIN_B$, the DICO further comprises a number of $IIN_B$-referencing current sources plus a current mirror connected to $TNX_{SB}$ and $TNX_{LB}$.

15. The HYSCP of claim 2 wherein said current steering switch further comprises a pair of differentially connected steering transistors in turn connected to the IOS for respectively supplying $IOS_A$ and $IOS_B$, said steering control signal comprises a pair of differential steering signals respectively coupled to a control terminal of the steering transistors.

16. An accurate hysteretic comparator (HYSCP) for comparing an input signal voltage $VIN_A$ with an input signal voltage $VIN_B$ and producing a 2-level output signal VOT reflecting the relative magnitude between $VIN_A$ and $VIN_B$ with a hysteresis window $V_{hys}$, the HYSCP comprises:
   a differential input stage with current output (DICO) having a number of differentially connected input transistors with transistor transconductance $Gm_{trx}$ for converting said $VIN_A$ and $VIN_B$, with an input stage transconductance $Gm_{in}$, into corresponding intermediate signal currents $IIN_A$ and $IIN_B$;
   a steerable offset current generator (SOCG), controlled by a logic steering control signal, for generating and steering an offset current IOS through either one of its two output offset currents $IOS_A$ or $IOS_B$; and
   a current-to-voltage summing converter (IVSC) connected to the $IIN_A$, $IOS_A$, $IIN_B$ and $IOS_B$ for:
      respectively summing the currents ($IIN_A$, $IOS_A$) and the currents ($IIN_B$, $IOS_B$) and converting the summed currents into the 2-level output signal VOT plus the steering control signal having its logic states corresponding to the VOT levels thus causing $V_{hys}$=IOS/$Gm_{in}$; and
   wherein the input transistors are connected to form negative feedback loops, such that the transistor transconductance $Gm_{trx}$ are largely negated from the input stage transconductance $Gm_{in}$ and
   wherein said IVSC comprises:
      a summing transistor $TNX_{SUMA}$ connected to the currents ($IIN_A$, $IOS_A$) for summing them up and converting the summation into an interim differential output signal $Vio_A$;
      a summing transistor $TNX_{SUMB}$ connected to the currents ($IIN_B$, $IOS_B$) for summing them up and converting the summation into an interim differential output signal $Vio_B$; and
      an output gain stage (OGS) coupled to the interim differential output signals ($Vio_A$, $Vio_B$) for amplifying them into the VOT and generating the steering control signal.

17. A method of making a hysteretic comparator (HYSCP) with an accurate hysteresis window $V_{hys}$ for comparing input signal voltages $VIN_A$ and $VIN_B$ and producing a 2-level output signal VOT, the method comprises:

providing a differential input stage with current output (DICO) having a number of differentially connected input transistors with transistor transconductance $Gm_{mx}$ for converting said $VIN_A$ and $VIN_B$, with an input stage transconductance $Gm_{in}$, into corresponding intermediate signal currents $IIN_A$ and $IIN_B$;

providing a steerable offset current generator (SOCG), controlled by a logic steering control signal, for generating and steering a built-in offset current source IOS through either one of its two output offset currents $IOS_A$ or $IOS_B$;

providing a current-to-voltage summing converter (IVSC) connected to the $IIN_A$, $IOS_A$, $IIN_B$ and $IOS_B$ for respectively summing the currents ($IIN_A$, $IOS_A$) and the currents ($IIN_B$, $IOS_B$) and converting the summed currents into the 2-level output signal VOT plus the steering control signal having its logic states corresponding to the VOT levels thus causing $V_{hys}=IOS/Gm_{in}$;

connecting the input transistors to form negative feedback loops, such that transistor transconductance $Gm_{mx}$ are largely negated from the input stage transconductance $Gm_{in}$; and as part of the DICO, adding a feedback resistance $R_{NF}$ connected to the input transistors such that $Gm_{in}$ becomes essentially equal to the feedback conductance $G_{NF}=1/R_{NF}$ independent of the $Gm_{mx}$ whose large variation over transistor fabrication process and device operating environment would otherwise cause a corresponding inaccuracy of the $V_{hys}$.

18. The method of making a HYSCP with an accurate $V_{hys}$ of claim 17 wherein providing the DICO further comprises:

providing a differentially connected pair of input switching transistor $TNX_{SA}$ and input switching transistor $TNX_{SB}$ with their (transistor transconductance, output impedance) respectively equal to ($Gm_{SA}$, $R_{SA}$) and ($Gm_{SB}$, $R_{SB}$); and providing a differential pair of input load transistor $TNX_{LA}$ and input load transistor $TNX_{LB}$, respectively coupled to $TNX_{SA}$ and $TNX_{SB}$ in a staggered configuration, with their (transistor transconductance, output impedance) respectively equal to ($Gm_{LA}$, $R_{LA}$) and ($Gm_{LB}$, $R_{LB}$); and wherein the method further comprises:

sizing $R_{NF}$ such that it meets the following criterion:

$$(1/R_{NF}) \gg (Gm_{SA}/(Gm_{LA} \times R_{SA})) + (Gm_{SB}/(Gm_{LB} \times R_{SB})).$$

* * * * *